(12) United States Patent
Mitchels et al.

(10) Patent No.: US 10,475,629 B2
(45) Date of Patent: Nov. 12, 2019

(54) CHARGED-PARTICLE MICROSCOPE WITH IN SITU DEPOSITION FUNCTIONALITY

(71) Applicant: FEI Company, Hillsboro, OR (US)

(72) Inventors: John Mitchels, Brno (CZ); Rudolf Johannes Peter Gerardus Schampers, Tegelen (NL); Michal Hrouzek, Bystrc (CZ); Tomas Gardelka, Vyskov (CZ)

(73) Assignee: FEI Company, Hillsboro, OR (US)

( * ) Notice: Subject to any disclaimer, the term of this patent is extended or adjusted under 35 U.S.C. 154(b) by 563 days.

(21) Appl. No.: 15/170,672

(22) Filed: Jun. 1, 2016

(65) Prior Publication Data

US 2017/0345627 A1 Nov. 30, 2017

(30) Foreign Application Priority Data

May 27, 2016 (EP) .................................... 16171645

(51) Int. Cl.
*H01J 37/34* (2006.01)
*C23C 14/35* (2006.01)
(Continued)

(52) U.S. Cl.
CPC .......... *H01J 37/3405* (2013.01); *C23C 14/35* (2013.01); *H01J 37/06* (2013.01);
(Continued)

(58) Field of Classification Search
CPC . C23C 14/35; H01J 37/06; H01J 37/08; H01J 37/18; H01J 37/20; H01J 37/26;
(Continued)

(56) References Cited

U.S. PATENT DOCUMENTS

2004/0099638 A1 5/2004 Miller
2004/0124356 A1 7/2004 Scholtz et al.
(Continued)

FOREIGN PATENT DOCUMENTS

| CN | 201374309 | 12/2009 |
|---|---|---|
| JP | 03-20943 | * 1/1991 |
| JP | 2004119291 | 4/2004 |

OTHER PUBLICATIONS

Machine Translation JP 2004-119291 dated Apr. 2004. (Year: 2004).*
(Continued)

*Primary Examiner* — Rodney G McDonald

(57) ABSTRACT

A charged-particle microscope, comprising a vacuum chamber in which are provided:
A specimen holder for holding a specimen in an irradiation position;
A particle-optical column, for producing a charged particle beam and directing it so as to irradiate the specimen;
A detector, for detecting a flux of radiation emanating from the specimen in response to irradiation by said beam,
wherein:
Said vacuum chamber comprises an in situ magnetron sputter deposition module, comprising a magnetron sputter source for producing a vapor stream of target material;
A stage is configured to move a sample comprising at least part of said specimen between said irradiation position and a separate deposition position at said deposition module;
Said deposition module is configured to deposit a layer of said target material onto said sample when held at said deposition position.

16 Claims, 2 Drawing Sheets

Figure 1:
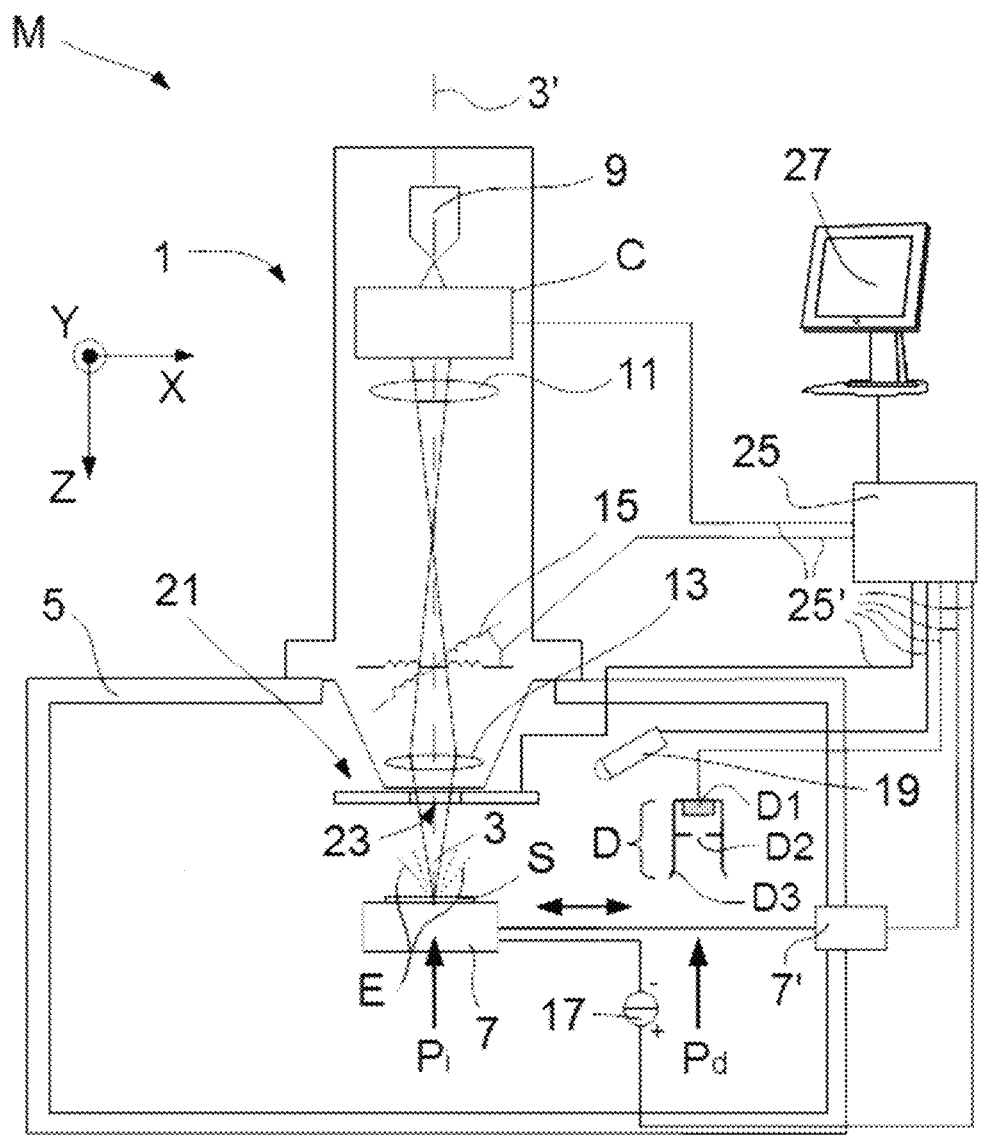

(51) Int. Cl.
H01J 37/26 (2006.01)
H01J 37/28 (2006.01)
H01J 37/06 (2006.01)
H01J 37/08 (2006.01)
H01J 37/18 (2006.01)
H01J 37/20 (2006.01)
H01J 37/285 (2006.01)
H01J 37/32 (2006.01)

(52) U.S. Cl.
CPC .............. *H01J 37/08* (2013.01); *H01J 37/18* (2013.01); *H01J 37/20* (2013.01); *H01J 37/26* (2013.01); *H01J 37/28* (2013.01); *H01J 37/285* (2013.01); *H01J 37/32623* (2013.01); *H01J 37/3464* (2013.01); *H01J 2237/3137* (2013.01)

(58) Field of Classification Search
CPC .... H01J 37/28; H01J 37/285; H01J 37/32623; H01J 37/3405; H01J 37/3464; H01J 2237/3137
USPC .............. 204/192.3, 192.32, 192.34, 298.32, 204/298.36
See application file for complete search history.

(56) References Cited

U.S. PATENT DOCUMENTS

| | | |
|---|---|---|
| 2004/0151991 A1 | 8/2004 | Stewart et al. |
| 2004/0261719 A1 | 12/2004 | Arjavac et al. |
| 2005/0279934 A1 | 12/2005 | Stewart et al. |
| 2006/0045987 A1 | 3/2006 | Chandler et al. |
| 2008/0073587 A1 | 3/2008 | Schmidt et al. |
| 2009/0111036 A1 | 4/2009 | Stewart et al. |
| 2010/0032302 A1 | 2/2010 | Holtermann et al. |
| 2010/0159370 A1 | 6/2010 | Jong et al. |
| 2010/0316811 A1 | 12/2010 | Mulders |
| 2014/0138350 A1 | 5/2014 | Kelley |
| 2014/0157914 A1 | 6/2014 | Fischione et al. |
| 2014/0190934 A1 | 7/2014 | Schmidt et al. |
| 2014/0302252 A1 | 10/2014 | Mulders et al. |
| 2015/0330877 A1 | 11/2015 | Schmidt et al. |
| 2015/0348752 A1 | 12/2015 | Foord et al. |
| 2015/0369710 A1 | 12/2015 | Fuller et al. |
| 2016/0093464 A1* | 3/2016 | Suzuki .................. H01J 37/20 250/442.11 |

OTHER PUBLICATIONS

"Electron Microscope", Wikipedia, Retrieved from the Internet Oct. 15, 2015, http://en.wikipedia.org/wiki/Electron_microscope, 11 pages.
"Environmental Scanning Electron Microscope", Wikipedia, Retrieved from the internet Oct. 24, 2016, , 18 pages.
"Focused Ion Beam", Wikipedia, Retrieved from the Internet Jul. 25, 2016 https://en.wikipedia.org/wiki/Focused_ion_beam, 7 pages.
"Scanning Electron Microscope", Wikipedia. Retrieved from the internet Aug. 4, 2016, http://en.wikipedia.org/wiki/Scanning_electron_microscope, 18 pages.
"Scanning Helium Ion Microscope".Wikipedia, Retrieved from the internet on Oct. 15, 2015, http://en.wikipedia.org/wiki/Scanning_Helium_Ion_Microscope, 2 pages.
"Scanning Transmission Electron Microscopy", Wikipedia, Retrieved from the internet Oct. 15, 2015, http://en.wikipedia.org/wiki/Scanning_transmission_electron_microscopy, 5 pages.
"Transmission Electron Microscopy", Wikipedia, Retrieved from the internet Oct. 15, 2015, http://en.wikipedia.org/wiki/Transmission_ electron_microscopy, 23 pages.
Escovitz, W.H. et al., "Scanning Transmission Ion Microscope with a Field Ion Source," Proc. Nat. Acad. Sci. USA, May 1975, pp. 1826-1828, vol. 72, No. 5.
Kelly, P.J. et al, "Magnetron sputtering: a review of recent developments and applications," Vacuum, Mar. 2000, pp. 15-172, vol. 56, Issue 3.
Muehle, U. et al., "FIB-based target preparations of complex material systems for advanced TEM investigations," Microscopy: Science, Technology, Applications and Education, Microscopy Book Series 4 (2010): pp. 1704-1716.
Rigort, A, et al., "Cryo-focused-ion-beam applications in structural biology," Arch Biochem Biophys, Sep. 1, 2015, pp. 122-130, vol. 581.
Unknown, Database WPI, Week 201008, Dec. 30, 2009, Thomson Scientific, London, GB XP002763541.
Varentsov, D. et al. "First biological images with high-energy proton microscopy", Physica Medica (2013), pp. 208-213, vol. 29.

* cited by examiner

CHARGED-PARTICLE MICROSCOPE WITH IN SITU DEPOSITION FUNCTIONALITY

The invention relates to a charged-particle microscope, comprising a vacuum chamber in which are provided:
- A specimen holder for holding a specimen in an irradiation position;
- A particle-optical column, for producing a charged-particle beam and directing it so as to irradiate the specimen;
- A detector, for detecting a flux of radiation emanating from the specimen in response to irradiation by said beam.

The invention also relates to a method of using such a charged-particle microscope.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:

- In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.
- In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.

More information on some of the topics elucidated here can, for example, be gleaned from the following Wikipedia links:
- http://en.wikipedia.org/wiki/Electron_microscope
- http://en.wikipedia.org/wiki/Scanning_electron_microscope
- http://en.wikipedia.org/wiki/Transmission_electron_microscopy
- http://en.wikipedia.org/wiki/Scanning_transmission_electron_microscopy As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance. As regards non-electron-based charged particle microscopy, some further information can, for example, be gleaned from references such as the following:
- https://en.wikipedia.org/wiki/Focused_ion_beam
- http://en.wikipedia.org/wiki/Scanning_Helium_Ion_Microscope
- W. H. Escovitz, T. R. Fox and R. Levi-Setti, *Scanning Transmission Ion Microscope with a Field Ion Source*, Proc. Nat. Acad. Sci. USA 72(5), pp 1826-1828 (1975). http://www.ncbi.nlm.nih.gov/pubmed/22472444

It should be noted that, in addition to imaging and performing (localized) surface modification (e.g. milling, etching, deposition, etc.), a charged particle microscope may also have other functionalities, such as performing spectroscopy, examining diffractograms, etc.

In all cases, a Charged-Particle Microscope (CPM) will comprise at least the following components:
- A particle-optical column comprising:
  - A radiation source, such as a Schottky electron source or ion gun.
  - An illuminator, which serves to manipulate a "raw" radiation beam from the source and perform upon it certain operations such as focusing, aberration mitigation, cropping (with an aperture), filtering, etc. It will generally comprise one or more (charged-particle) lenses, and may comprise other types of (particle-)optical component also. If desired, the illuminator can be provided with a deflector system that can be invoked to cause its exit beam to perform a scanning motion across the specimen being investigated.
- A specimen holder, on which a specimen under investigation can be held and positioned (e.g. tilted, rotated). If desired, this holder can be moved so as to effect scanning motion of the beam w.r.t. the specimen. In general, such a specimen holder will be connected to a positioning system.
- A detector (for detecting radiation emanating from an irradiated specimen), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations.

In the particular case of a dual-beam microscope, there will be (at least) two particle-optical columns, for producing two different species of charged particle. Commonly, an electron column (arranged vertically) will be used to image the specimen, and an ion column (arranged at an angle) will be used to (concurrently) machine/process the specimen, whereby the specimen holder can be positioned in multiple degrees of freedom so as to suitably "present" a surface of the specimen to the employed electron/ion beams.

In the case of a transmission-type microscope (such as a (S)TEM, for example), a CPM will specifically comprise:
- An imaging system, which essentially takes charged particles that are transmitted through a specimen (plane) and directs (focuses) them onto analysis apparatus, such as a detection/imaging device, spectroscopic apparatus (such as an EELS device), etc. As with the illuminator referred to above, the imaging system may also perform other functions, such as aberration mitigation, cropping, filtering, etc., and it will generally comprise one or more charged-particle lenses and/or other types of particle-optical components.

In what follows, the invention may—by way of example—sometimes be set forth in the specific context of electron microscopy; however, such simplification is intended solely for clarity/illustrative purposes, and should not be interpreted as limiting.

As already mentioned, an example of an apparatus as set forth in the opening paragraph above is a FIB-SEM, and an important (but non-limiting) example of the use of such an apparatus is in the preparation of so-called TEM lamellae. As indicated above, TEM samples need to be very thin, and they are generally prepared using highly specialized techniques. In one such technique, a focused ion beam (FIB) is used to cut/slice/extricate one or more lamella/lamellae from a bulk specimen, whereby, in general:

Electron-beam imaging is used to find/position a particular zone of interest on a specimen that is mounted to the specimen holder;

The FIB is used to perform various incisions necessary to liberate a lamella from the (identified zone of the) specimen;

The lamella thus differentiated from the rest of the specimen is picked up/moved using a needle-like manipulator, attached to a positioning stage.

Lamella produced in this manner can then be removed from the FIB-SEM (with the aid of said manipulator), and studied in a (S)TEM, or in other analysis apparatus. For some general information on TEM lamella preparation, see, for example, the article by U. Muehle et al. in *Microscopy: Science, Technology, Applications and Education*, pp. 1704-1716, 2010 (Formatex):

http://www.formatex.info/microscopy4/1704-1716.pdf

For more information on the use of a FIB-SEM to prepare samples for life sciences studies, see, for example, the following reference:

http://www.ncbi.nlm.nih.gov/pubmed/25703192

Both of these publications are incorporated herein by reference.

In many cases, it will be desirable to (at least partially) provide such a lamella/sample with an electrically conductive (e.g. metallic) coating before studying it in a CPM. Such a coating helps mitigate electrostatic charging of the lamella/sample—which can have a detrimental effect on the imaging process/apparatus, but can also produce unwanted recrystallization/electron damage effects in the lamella, for example. Alternatively, in SEM studies (for instance), such a coating can help increase the image brightness (electron yield) of a sample. A metallic coating on a sample can also help reduce heat load during subsequent irradiation sessions, for instance. There is presently a ready commercial availability of small, standalone, magnetron sputtering coaters that can be used to deposit a conducting (metallic) layer on lamellae (and other types of sample). In addition, some sputter coaters are available as "add-on" (satellite/ancillary) units that are mounted outside the vacuum chamber of a CPM and communicate with its interior via an airlock. Although the use of such coaters has produced tolerable results up to now, there is always room for improvement. In that context, the current inventors have worked extensively to identify shortcomings in this conventional approach, and to address these effectively so as to produce improved results. The results of such endeavor are the subject of the current application.

It is an object of the invention to provide a more versatile CPM than currently available. Additionally, it is an object of the invention to provide an innovative way of preparing lamellae and other samples for use in CPM studies. More specifically, it is an object of the invention that this technique should employ a novel approach to sputter-coating of such lamellae/samples.

These and other objects are achieved in an apparatus as set forth in the opening paragraph above, characterized in that:

Said vacuum chamber comprises an in situ magnetron sputter deposition module, comprising a magnetron sputter source for producing a vapor stream of target material;

A stage is configured to move a sample comprising at least part of said specimen between said irradiation position and a separate deposition position at said deposition module;

Said deposition module is configured to deposit a layer of said target material onto said sample when held at said deposition position.

The invention has a number of pronounced advantages relative to the prior art. In particular:

Removing a sample from a CPM and transferring it to a standalone sputtering coater introduces a contamination risk, whereby contaminants can land on a naked sample surface and subsequently be encased under the sputter-coated layer. Being able to sputter-coat a sample in situ in the CPM eliminates this risk.

As an extension of the previous point, having an in situ sputter module (station/bay) in the CPM greatly facilitates quality control and rework of a sample. After sputter-coating the sample at the in situ sputter module, it can easily be moved back to the irradiation position and imaged—without having to break vacuum. If, on the basis of said imaging, the coating process is judged to be sub-standard in some way, the sample can easily be moved back to the in situ sputter module for rework—again without having to break vacuum.

For cryogenic samples—which have to be prepared, handled and stored at cryogenic temperatures—it greatly simplifies workflow and reduces the risk of sample degradation if the number of sample transfers between different environments can be kept to a minimum. Having an in situ sputter module in the CPM is highly beneficial in this regard.

Although existing CPMs may already have an in situ deposition functionality in the form of IBID or EBID (Electron-Beam-Induced Deposition), it should be noted that such techniques are more suited to performing very localized deposition ("spot deposition") of material. The in situ magnetron sputtering module of the present invention is much more suited to applying a "global" coating of a regular thickness to an entire sample surface. Moreover, by their very nature, IBID/EBID tend to cause heating of the sample on which they are performed—which is unacceptable in the case of cryogenic (e.g. vitrified) samples, for example; on the other hand, magnetron sputter deposition can be performed without substantial sample heating.

It should be noted that the magnetron sputtering module of the present invention may be of a DC (direct current) or RF (radio frequency) type, according to the needs of a given situation, and that it can be used to deposit layers of various types of materials, including metallic, dielectric, insulating and blends/hybrids, etc.; for example, one might elect to use the in situ sputter module to deposit a protective insulating layer on a sample that has been freshly cut from a progenitor specimen, so as to protect (a surface of) the sample from subsequent oxidation/corrosion. If desired, the invention allows a plurality of different in situ magnetron sputter modules to be present in a single CPM—which modules may, for example, be of different types, and/or for depositing different materials, and/or in different orientations/locations, etc. The stage used to transfer the sample between the irradiation position and the deposition position may comprise (part of) the aforementioned specimen holder (and an associated positioning system/set of actuators) [see FIG. 1, for example], but it may also be a dedicated transfer tool, e.g. an actuated manipulator as referred to above, or some other type of movable (robot) arm [see FIG. 2, for example]. For some general information on magnetron sputtering as a process, reference is made to the journal article by P. J. Kelly and R. D. Arnell in *Vacuum* 56(3), pp. 159-172, March 2000 (Elsevier):

> http://www.sciencedirect.com/science/article/pii/S0042207X9900189X which is incorporated herein by reference.

In a particular embodiment of the invention, the in situ deposition module comprises a limiting aperture, disposed between said sputter source and said deposition position, for limiting a footprint of said vapor stream presented at said deposition position. Because the deposition module is situated within the CPM's vacuum chamber, it is desirable to able to control any disadvantageous effects that might be caused by unintended migration of gaseous material out of the sputter module and into the general vacuum environment of the CPM. Using a limiting aperture as described here is useful in that it can be used to define a specific shape/size of the vapor stream's cross-section upstream of a sample located at the deposition position, thereby blocking portions of that cross-section that wouldn't impinge on the sample anyway. An aperture of this type might, for example, be provided in a carrier plate of metal, ceramic or glass. If desired, the aperture may be interchangeable with other (differently embodied) apertures, e.g. stored in a library. Alternatively, it may be an intrinsically adjustable aperture, as in the case of a diaphragm/iris, or a set of cooperating sliding plates, for example. A useful variant of this embodiment employs a closable aperture—or a dedicated shutter/blanker—to allow the vapor stream to be closed off from reaching the sample while the magnetron sputter source is warming up/stabilizing prior to deposition.

In another embodiment of the invention, the deposition module comprises a skirt (collar/retainer) around a perimeter of the deposition position, for curtailing migration of said vapor stream into said vacuum chamber. Such a set-up can be used as an alternative or as a supplement to a limiting aperture as set forth in the previous paragraph. The skirt may, for example, have a lateral cross-section (perpendicular to the nominal vapor stream) that is matched to (approximately equal to or smaller than) a lateral cross-section of a sample carrier comprised in the employed stage, so as to limit passage/escape of vapor beyond an outer boundary of said stage. The skirt may, for example, be made of metal sheeting that is formed into a suitable shape.

In yet another embodiment of the present invention, the deposition module comprises a tubular member (sleeve/tunnel) configured such that:

The magnetron sputter source is disposed proximal a first end (mouth) of said tubular member;

The deposition position is disposed proximal a second, opposite end (mouth) of said tubular member.

Once again, such an arrangement can be used as an alternative or as a supplement to an embodiment as set forth in either/both of the two previous paragraphs. By using a tubular member in this way, the vapor stream is laterally confined along its entire course from source to sample. The lateral cross-section of the tubular member can, in principle, be any shape—although it will ideally be matched/adapted at its second end (at least) to a lateral cross-section of a sample carrier comprised in the employed stage. Said cross-section need not be constant: the tubular member can, for example, taper toward either of its ends.

In another embodiment of the present invention, the deposition module is configured to be retractable when not in use. In such an embodiment, the deposition module is mobile, and has a "deployed location/configuration", which is matched to the aforementioned deposition position, and a "parked location/configuration", in which the module is essentially "gotten out of the way". Such a set-up can be advantageous in view of the typically highly crowded/cramped space in a CPM. Deployment/retraction of the module may, for example, be achieved using an actuator system, e.g. by attaching the module to an actuated arm/sled, which may make a linear and/or curved motion as required/desired. It should, however, be realized that such retractability is purely optional: if desired/preferred, the in situ deposition module may be in a fixed location.

Broadly speaking, a magnetron sputtering process creates a plasma in the vicinity of a target of sputter material, and this plasma erodes/attacks the target and locally vaporizes it to produce the abovementioned vapor stream. Said plasma may, for example, be generated by applying a first electrical potential to the sputter target and a second electrical potential (e.g. ground) to an associated magnetron electrode/shield (or, in some cases, the sample itself), thereby causing a high-voltage potential difference between them that serves to ionize a sputter gas present near the target. In the present invention, this sputter gas can be administered separately into the in situ sputter module; however, alternatively/supplementally, one can introduce a background gas more generally into a broader region of the CPM's vacuum chamber, e.g. as in the case of a so-called "low-vacuum SEM". In a similar way, one could envisage using the process gas in an "Environmental SEM (ESEM)" for this purpose. Some general information on ESEMs can, for example, be gleaned from the following Wikipedia reference:

> https://en.wikipedia.org/wiki/Environmental_scanning_electron_microscope

The invention will now be elucidated in more detail on the basis of exemplary embodiments and the accompanying schematic drawings, in which:

FIG. 1 renders a longitudinal cross-sectional view of an embodiment of a CPM in which the present invention is implemented.

Figure 2:
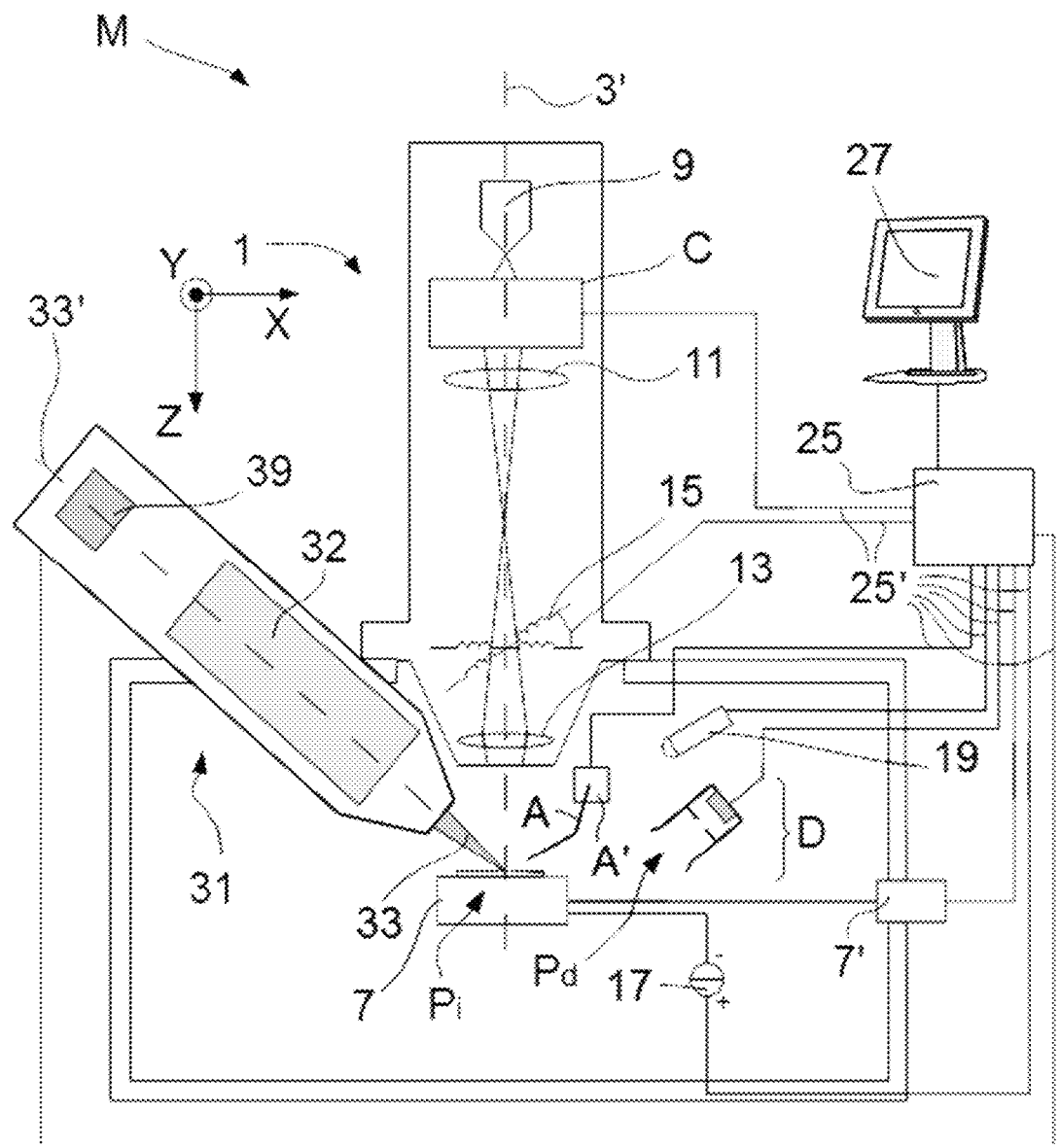

FIG. 2 renders a longitudinal cross-sectional view of an alternative CPM in which the present invention is implemented.

In the Figures, where pertinent, corresponding parts may be indicated using corresponding reference symbols.

EMBODIMENT 1

FIG. 1 is a highly schematic depiction of an embodiment of a CPM in which the present invention is implemented; more specifically, it shows an embodiment of a microscope M, which, in this case, is a SEM (though, in the context of the current invention, it could just as validly be a (S)TEM, or an ion-based microscope, for example). The microscope M comprises a particle-optical column (illuminator) 1, which produces a beam 3 of input charged particles (in this case, an electron beam) that propagates along a particle-optical axis 3'. The column 1 is mounted on a vacuum chamber 5, which comprises a specimen holder 7 and associated actuator(s) 7' for holding/positioning a specimen S. The vacuum chamber 5 is evacuated using vacuum pumps (not depicted). With the aid of voltage supply 17, the specimen holder 7, or at least the specimen S, may, if desired, be biased (floated) to an electrical potential with respect to ground.

The column 1 (in the present case) comprises an electron source 9 (such as a Schottky gun, for example), lenses 11, 13 to focus the electron beam 3 onto the specimen S, and a deflection unit 15 (to perform beam steering/scanning of the beam 3). The microscope M further comprises a controller/computer processing apparatus 25 for controlling inter alia the deflection unit 15, lenses 11, 13 and detectors 19, 21, and displaying information gathered from the detectors 19, 21 on a display unit 27.

The detectors 19, 21 are chosen from a variety of possible detector types that can be used to examine different types of emergent radiation E emanating from the specimen S in response to irradiation by the input beam 3. In the apparatus depicted here, the following (non-limiting) detector choices have been made:

Detector 19 is a solid state detector (such as a photodiode) that is used to detect cathodoluminescence emanating from the specimen S. It could alternatively be an X-ray detector, such as Silicon Drift Detector (SDD) or Silicon Lithium (Si(Li)) detector, for example.

Detector 21 is a segmented silicon electron detector, comprising a plurality of independent detection segments (e.g. quadrants) disposed in annular configuration about a central aperture 23 (allowing passage of the primary beam 3). Such a detector can, for example, be used to investigate the angular dependence of a flux of emergent backscattered electrons emanating from the specimen S. It will typically be biased to a positive potential, so as to attract electrons emitted from the specimen S.

The skilled artisan will understand that many different types of detector can be chosen in a set-up such as that depicted.

By scanning the input beam 3 over the specimen S, emergent radiation—comprising, for example, X-rays, infrared/visible/ultraviolet light, secondary electrons (SEs) and/or backscattered electrons (BSEs)—emanates from the specimen S. Since such emergent radiation is position-sensitive (due to said scanning motion), the information obtained from the detectors 19, 21 will also be position-dependent. This fact allows (for instance) the signal from detector 21 to be used to produce a BSE image of (part of) the specimen S, which image is basically a map of said signal as a function of scan-path position on the specimen S.

The signals from the detectors 19, 21 pass along control lines (buses) 25', are processed by the controller 25, and displayed on display unit 27. Such processing may include operations such as combining, integrating, subtracting, false colouring, edge enhancing, and other processing known to the skilled artisan. In addition, automated recognition processes (e.g. as used for particle analysis) may be included in such processing.

It should be noted that many refinements and alternatives of such a set-up will be known to the skilled artisan, including, but not limited to:

The use of dual beams—for example an electron beam 3 for imaging and an ion beam 33 for machining (or, in some cases, imaging) the specimen S—see FIG. 2, for example;

The use of a controlled environment at the specimen S—for example, maintaining a pressure of several mbar (as used in a so-called Environmental SEM) or by admitting gases, such as etching or precursor gases, etc.

In the specific context of the current invention, the vacuum chamber 5 comprises an in situ magnetron sputter deposition module D, which is here located to the right side of the axis 3' (but could also be located elsewhere within the chamber 5). This module D comprises a magnetron sputter source D1 for producing a vapor stream of target material, and, in the present embodiment, a limiting aperture D2 is located in the path of this stream, so as to perform appropriate shaping/sizing of the cross-section/footprint of this stream. As here depicted, the source D1 is located at one end (upper end) of a tubular member D3, whose other end (lower end) is flared so as to form a skirt, beneath/within which a sample can be held during a visit to module D. To this end, a stage (in the present case, items 7'/7) is configured to move (substantially in an XY plane) a sample—comprising at least part of specimen S—between an irradiation position Pi beneath column 1 (along axis 3') and a separate(d) deposition position Pd beneath deposition module D. While the sample is held at this deposition position Pd, the module D can be invoked to deposit a layer of the target material (e.g. a metal such as gold) onto a presented face of the sample.

EMBODIMENT 2

FIG. 2 shows a variant of the CPM in FIG. 1—in this case a so-called FIB-SEM. This is largely identical to the apparatus of FIG. 1, except in that it comprises an ion-optical column 31 in addition to the aforementioned electron-optical column 1. In analogy to the electron column 1, the ion column 31 comprises an ion source 39 (such as a Knudsen cell, for example) and imaging optics 32, and these produce/direct an ion beam 33 along an ion-optical axis 33'. To facilitate easy axis to a specimen on holder 7, the ion axis 33' is canted relative to the electron axis 3'.

As hereabove described, such an ion (FIB) column 31 can be used inter alia to cut from a "bulk" specimen S a small sample, such as a thin lamella (flake/sliver), by performing a plurality of (angled) incisions that serve to liberate the sample (along its perimeter) from the surrounding specimen. In the current embodiment, a stage comprising a (needle-like) manipulator arm A, which can be actuated in various degrees of freedom by actuator system A', can then be used to transfer such a sample between the irradiation position P, where it was created (~intersection of axes 3' and 33') and a deposition position Pd facing (a mouth of) in situ magnetron sputter deposition module D, where it can be coated with (for example) a metallic later. Note in the present case that D is canted somewhat toward Pi, though this need not necessarily be the case. When the sample has been coated at module D, it can, if desired, be moved back to position Pi (using stage A/A'), where it can be inspected and/or further machined using electron column 1 and/or ion column 31. This procedure can, if desired/required, be performed in multiple iterations.

EMBODIMENT 3

In a specific example of TEM lamella preparation using the in situ magnetron sputter deposition module of the present invention, a (particular face of a) bulk specimen is first coated with about 1-10 nm of metal (e.g. Cr or Au), so as to improve imaging (contrast enhancement and anti-charging layer). Once a suitable image of said face is obtained, a lamella is excised from the face, using a FIB. In order to suppress charging effects, a further 1-5 nm of metal is deposited onto the lamella. Such deposition can, for example, be performed at a deposition rate of the order of about 1-10 nm per minute (typically), though this is discretionary. Sputter gas pressure in the deposition module is usually in a range of ca. 0.1-100 Pa, whereby a typical process gas is Argon. Plasma generation voltages are usually in a range of ca. 20-2000 V, with typical currents in a range of ca. 1-1000 mA. The magnetron can be cooled if needed, so as to control heating.

EMBODIMENT 4

The following is a non-exhaustive list of various exemplary situations in which the in situ magnetron sputter deposition module of the present invention can be employed:

For an insulating wafer sample, deposition of ca. 2-5 nm of Cr can suppress charging effects and give good backscatter images.

In the case of cryogenic samples (e.g. vitrified biological samples) which are prone to ice contamination, metal coatings of thickness ca. 1-10 nm improve imaging performance.

One can deposit a passivation layer, to shield and protect a delicate air-sensitive lamella/sample from oxidation/corrosion.

In photonics samples, the invention can be used for in situ deposition of a photoactive layer.

Organic materials can be sputtered, e.g. to create nano-polymer films.

Inorganic materials can be sputtered, e.g. to create a ceramic or glass layer.

A thin seed layer can be deposited on a device to promote better deposition of other layers.

The invention provides an in situ fabrication method for multilayer samples, allowing high-quality low-temperature depositions for constructing nanolayer stacks.

The invention claimed is:

1. A charged-particle microscope, comprising a vacuum chamber in which are provided:
    a specimen holder for holding a specimen in an irradiation position;
    a particle-optical column, for producing a charged particle beam and directing it so as to irradiate the specimen;
    a detector, for detecting a flux of radiation emanating from the specimen in response to irradiation by said beam;
    an in situ magnetron sputter deposition module, comprising a magnetron sputter source for producing a vapor stream of target material onto a sample comprising at least part of said specimen when said sample is held in a deposition position, said irradiation position and said deposition position are separated in the XY plane; and
    a stage configured to move said sample between said irradiation position and said deposition position.

2. A microscope according to claim 1, wherein said deposition module comprises a limiting aperture, disposed between said sputter source and said deposition position, for limiting a footprint of said vapor stream presented at said deposition position.

3. A microscope according to claim 1, wherein said deposition module comprises a skirt around a perimeter of said deposition position, for curtailing migration of said vapor stream into said vacuum chamber.

4. A microscope according to claim 1, wherein said deposition module comprises a tubular member configured such that:
    said sputter source is disposed proximal a first end of said tubular member; and
    said deposition position is disposed proximal a second, opposite end of said tubular member.

5. A microscope according to claim 1, which is a dual-beam microscope comprising:
    an electron-optical column, for producing an electron beam and directing it so as to irradiate the specimen; and
    an ion-optical column, for producing an ion beam and directing it so as to irradiate the specimen.

6. A microscope according to claim 1, wherein said deposition module is configured to be retracted from the deposition position when not in use.

7. A microscope according to claim 2, wherein said deposition module comprises a skirt around a perimeter of said deposition position, for curtailing migration of said vapor stream into said vacuum chamber.

8. A microscope according to claim 2, wherein said deposition module comprises a tubular member configured such that:
    said sputter source is disposed proximal a first end of said tubular member;
    said deposition position is disposed proximal a second, opposite end of said tubular member.

9. A microscope according to claim 3, wherein said deposition module comprises a tubular member configured such that:
    said sputter source is disposed proximal a first end of said tubular member; and
    said deposition position is disposed proximal a second, opposite end of said tubular member.

10. A microscope according to claim 2, which is a dual-beam microscope comprising:
    an electron-optical column, for producing an electron beam and directing it so as to irradiate the specimen; and
    an ion-optical column, for producing an ion beam and directing it so as to irradiate the specimen.

11. A microscope according to claim 3, which is a dual-beam microscope comprising:
    an electron-optical column, for producing an electron beam and directing it so as to irradiate the specimen; and
    an ion-optical column, for producing an ion beam and directing it so as to irradiate the specimen.

12. A microscope according to claim 4, which is a dual-beam microscope comprising:
    an electron-optical column, for producing an electron beam and directing it so as to irradiate the specimen; and
    an ion-optical column, for producing an ion beam and directing it so as to irradiate the specimen.

13. A microscope according to claim 1 in which the stage is configured to move the sample substantially in an XY plane between said irradiation position and said deposition position at said deposition module.

14. A microscope according to claim 1 in which said irradiation position and said deposition position do not overlap.

15. A microscope according to claim 1 in which said charged particle beam column comprises a scanning electron microscope column.

16. A microscope according to claim 5 in which said electron-optical column comprises a scanning electron microscope column.

* * * * *